United States Patent
Key et al.

(10) Patent No.: US 7,164,730 B2
(45) Date of Patent: Jan. 16, 2007

(54) DIGITAL DEMODULATOR, A TELECOMMUNICATIONS RECEIVER, AND A METHOD OF DIGITAL DEMODULATION

(75) Inventors: Michelle Lillian Key, Tetbury (GB); Irfan Mahmood, Swindon (GB); David John Wedge, Bristol (GB)

(73) Assignee: Lucent Technologies Inc., Murray Hill, NJ (US)

( * ) Notice: Subject to any disclaimer, the term of this patent is extended or adjusted under 35 U.S.C. 154(b) by 742 days.

(21) Appl. No.: 10/289,571

(22) Filed: Nov. 7, 2002

(65) Prior Publication Data

US 2003/0091128 A1    May 15, 2003

(51) Int. Cl.
*H04L 27/06* (2006.01)
(52) U.S. Cl. .................................... 375/316
(58) Field of Classification Search ......... 455/369, 455/236.1, 307, 130; 375/316, 130, 317–319, 375/322, 323, 329, 340, 334; 329/300, 304, 329/315, 345
See application file for complete search history.

(56) References Cited

U.S. PATENT DOCUMENTS

| 4,617,537 | A | | 10/1986 | Nossek | 332/48 |
|---|---|---|---|---|---|
| 4,701,934 | A | | 10/1987 | Jasper | 375/1 |
| 4,803,700 | A | | 2/1989 | Dewey et al. | 375/77 |
| 5,392,039 | A | * | 2/1995 | Thurston | 341/143 |
| 5,548,244 | A | * | 8/1996 | Clewer | 329/318 |
| 5,703,910 | A | * | 12/1997 | Durvaux et al. | 375/322 |
| 6,061,385 | A | * | 5/2000 | Ostman | 375/130 |
| 6,904,103 | B1 | * | 6/2005 | Okanobu | 375/316 |
| 2002/0012411 | A1 | * | 1/2002 | Heinzl et al. | 375/350 |

FOREIGN PATENT DOCUMENTS

| EP | 1 058 396 A1 | 12/2000 |
|---|---|---|
| GB | 2 244 410 A | 11/1991 |
| WO | WO 98/17038 | 4/1998 |
| WO | WO 01/19047 A1 | 3/2001 |

* cited by examiner

*Primary Examiner*—Tesfaldet Bocure

(57) ABSTRACT

A digital demodulator comprises means (14) to perform a complex frequency shift operation on the received signal so as to provide a first signal at an intermediate frequency of one quarter of the sampling frequency. The digital demodulator also comprises a quadrature down converter (22) operative to down convert the first signal so as to provide an output signal at baseband.

9 Claims, 4 Drawing Sheets

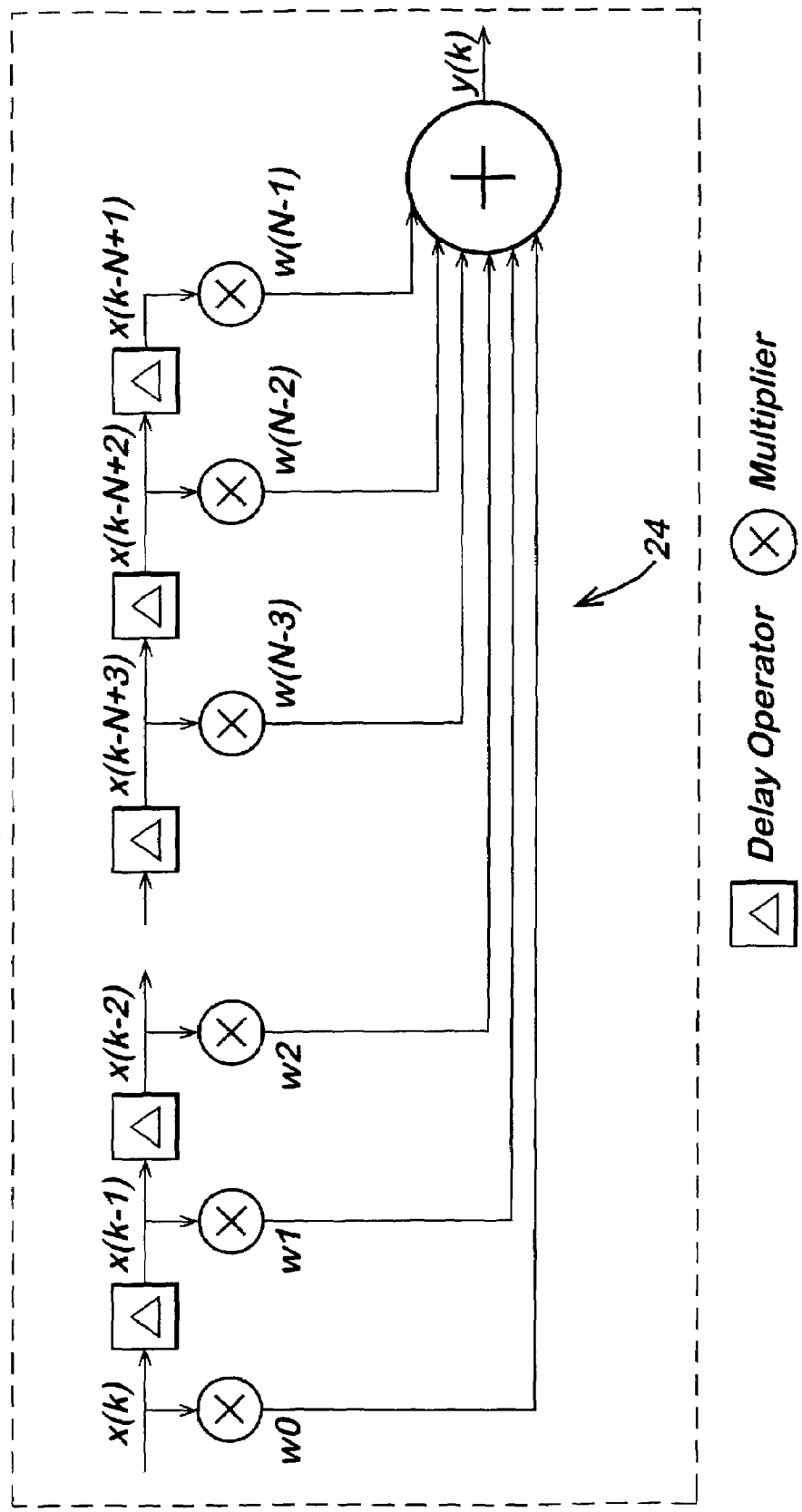

Fig. 3 *249.6 MHz Analogue IF*
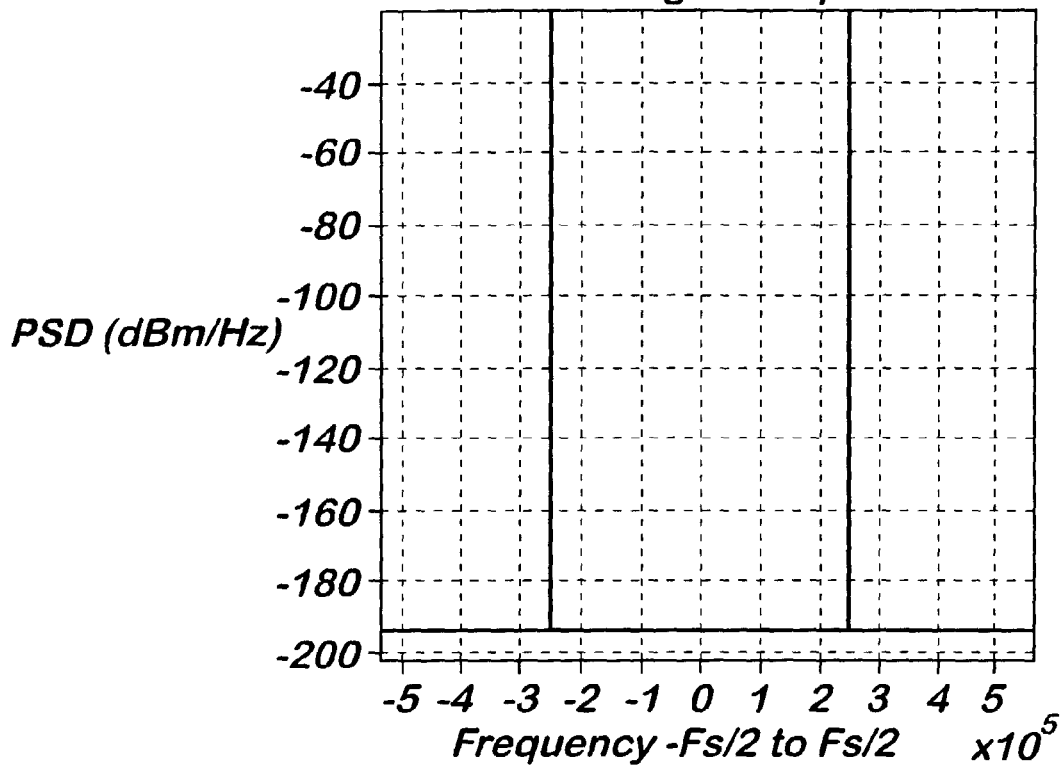
Fig. 4 *3.84 MHz Digital IF*
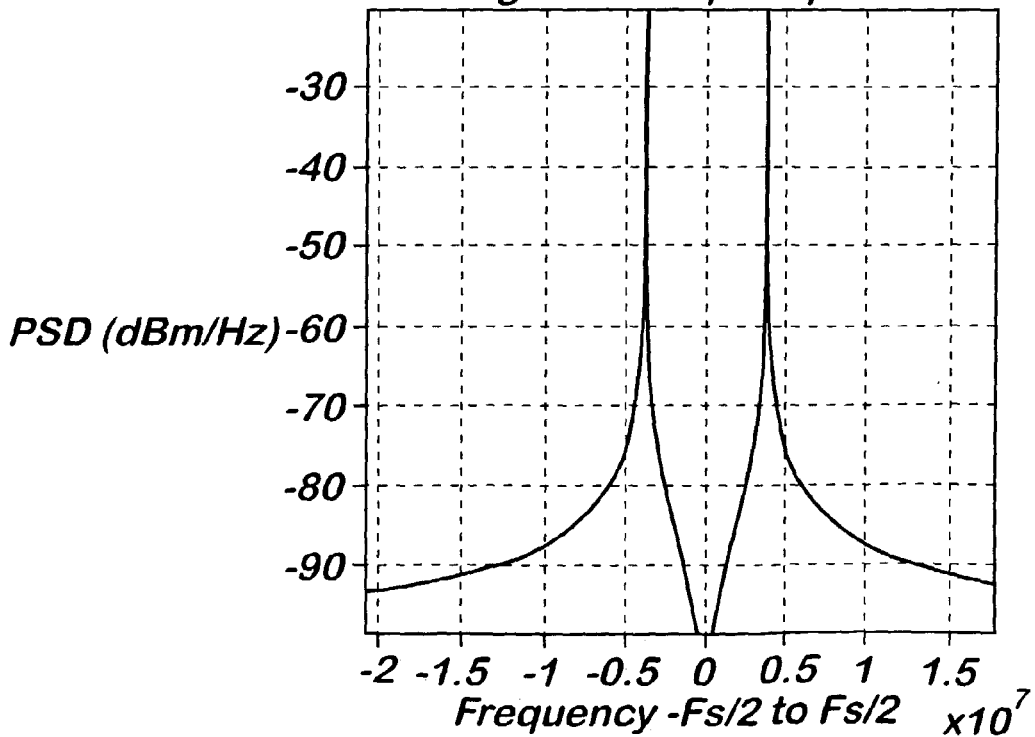

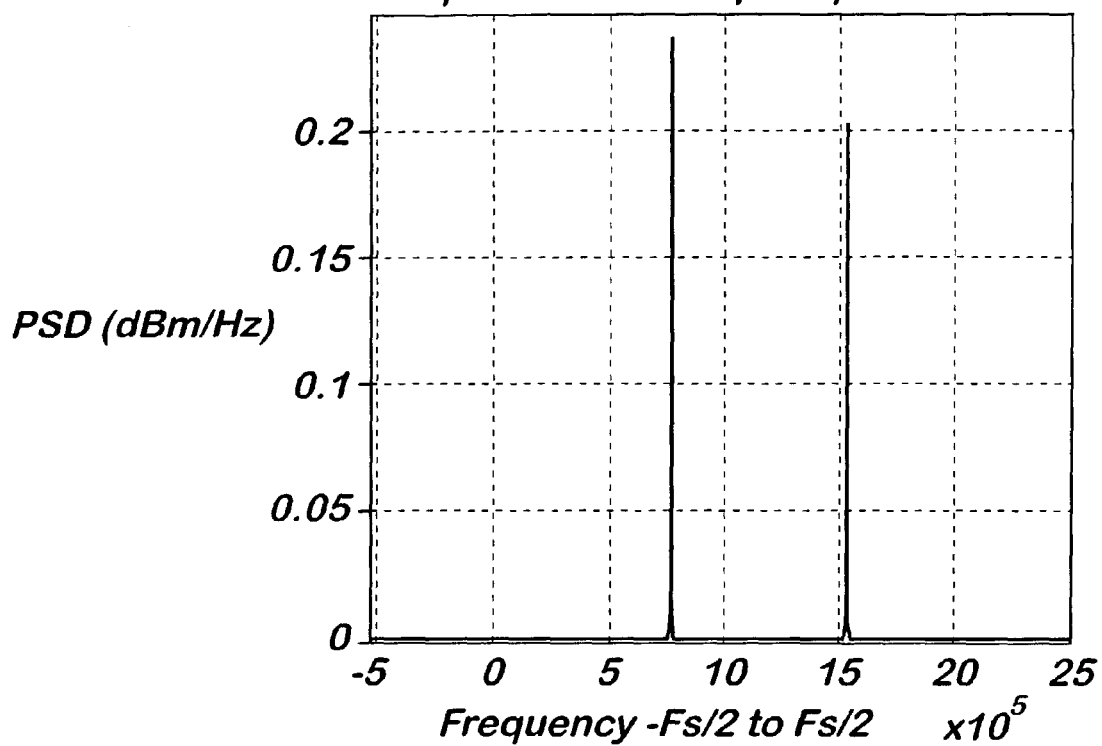
Fig. 5 15.36 MHz Digtal IF Upconverted Output Spectrum
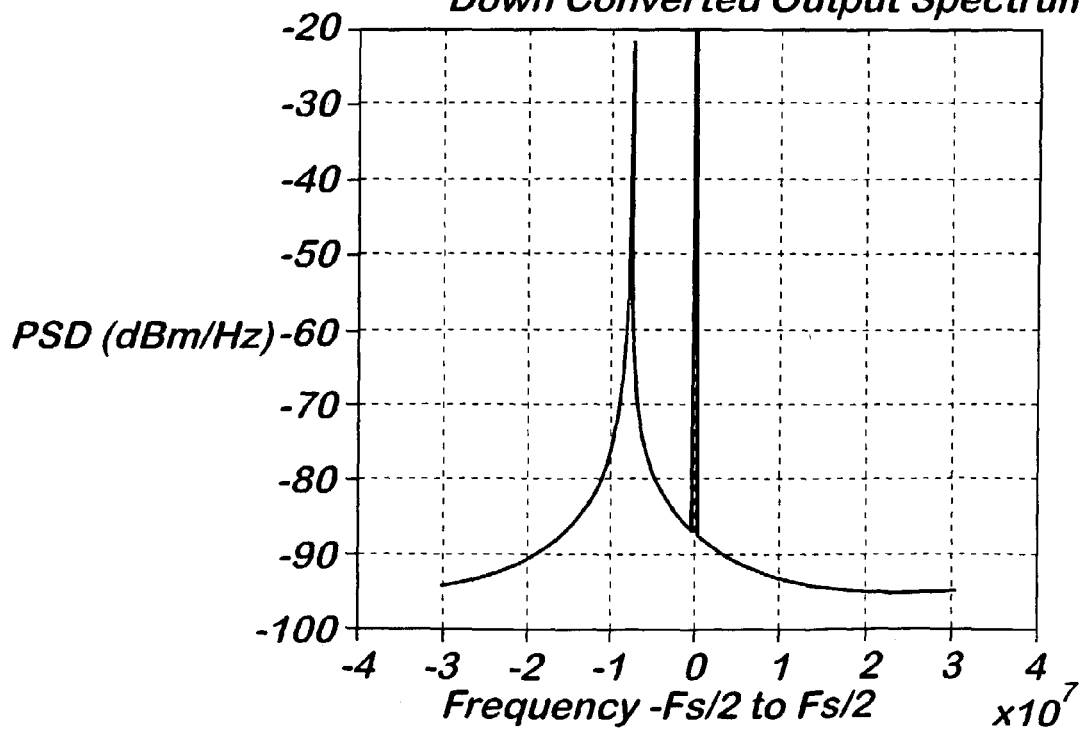
Fig. 6 Down Converted Base Band Signal Down Converted Output Spectrum

DIGITAL DEMODULATOR, A TELECOMMUNICATIONS RECEIVER, AND A METHOD OF DIGITAL DEMODULATION

CROSS REFERENCE TO RELATED APPLICATION

This application claims priority of Great Britain Application No. 0127683.1 filed on Nov. 19, 2001.

FIELD OF THE INVENTION

The present invention relates to a digital demodulator, a telecommunications receiver comprising the digital demodulator, and a method of digital demodulation.

BACKGROUND OF THE INVENTION

A main contributor to cost in digital demodulators used in radio receivers is the channel filter (lpfq_rx, lpfi_rx), which is a Finite Impulse Response (FIR) filter. To achieve the necessary rejection of unwanted signals, in particular for conformance with Third Generation Partnership Project (3 GPP) specifications, a large number of filter coefficients are required. This results in an FIR filter with many coefficients (each of high bit width).

Two optimisation techniques are known to be used in digital demodulators namely subsampling on the one hand, and on the other hand IQ channel filter optimisation by combination of the filtering with quadrature down conversion.

Subsampling is a recognised technique for reduction in the number of Intermediate Frequencies (IF) used in wideband radio receivers. Subsampling is primarily used to compensate for the limitations in known Analogue-to-Digital-Converters (ADC), with respect to their maximum sampling frequency and dynamic range. The digital intermediate frequency IF is reduced to a frequency of (fsignal mod Fsample) suitable for subsequent processing.

IQ channel filters are known to be optimised so as to reduce the number of Multiply-and-ACcumulate (MAC) engines required by the filter. This is done by combination with the quadrature down conversion stage; quadrature down conversion being the process by which a digital intermediate frequency (IF) at one quarter of the sampling frequency (Fsample/4) is shifted to baseband (0 Hertz). This process involves multiplications by the following sequences:

| | |
|---|---|
| Real part (cos θ) | 1, 0, −1, 0 . . . |
| Imaginary part (sin θ) | 0, 1, 0, −1, . . . |

By first multiplying the coefficients of the FIR filter by the above sequences, alternate coefficients become zero, thereby removing the need for every other MAC engine which would otherwise be required in the FIR filter. The computational intensity is thus halved provided the requirement is met that the digital IF is one quarter of the sampling frequency. However, as the digital intermediate frequency IF signal produced in a sub-sampling receiver is determined by the ADC sample rate and the selected analogue intermediate frequency (IF), it is not always possible to obtain a digital intermediate frequency IF at Fsample/4 so as to achieve this computational simplicity. There are often frequency spur considerations or existing architectural constraints, which prevent an analogue intermediate frequency (IF) being selected. The limitations of ADC converters are commonly recognised as one of the major design constraints in the field of radio receivers.

SUMMARY OF THE INVENTION

The present invention provides a digital demodulator comprising means to perform a complex frequency shift operation on the received signal so as to provide a first signal at an intermediate frequency of one quarter of the sampling frequency and a quadrature down converter operative to down convert the first signal so as to provide an output signal at baseband.

Advantageously the approach allows the two optimisation techniques mentioned above to be exploited where the received signal is not of a frequency of one quarter of the sampling frequency. This technique is applicable to the design of wideband radio receivers, specifically in the field of emergent 3G Wireless Communication Systems.

Advantageously the means is a numerically controlled oscillator NCO.

Advantageously the numerically controlled oscillator NCO comprises a sine mixer connected to a Hilbert transformer operative to shift the phase of the sine component of the signal by 90 degrees. Furthermore, advantageously, the numerically controlled oscillator NCO comprises a cosine mixer on a first branch and the sine mixer and Hilbert transformer on a second branch, the two branches being connected by a summing stage.

Advantageously, the quadrature down converter comprises an Fsample/4 sine and cosine mixer and FIR filters 24 of respective real and imaginary components.

Advantageously, the digital demodulator further comprises an analog to digital converter operative to provide a subsampled digital intermediate frequency signal to the means. Advantageously, the subsampled signal has a frequency less than one quarter of the sampling frequency.

Advantages lie in that the introduction of a Numerically Controlled Oscillator NCO to frequency shift the digital intermediate frequency IF signal produced by sub-sampling to provide a digital intermediate frequency IF signal at Fsample/4 is simple and cost effective; reducing the number of MAC operations required to implement the subsequent channel filter by half. It thus allows optimisation and cost reduction of the channel filters required in a sub-sampling receiver architecture, by reducing the number of Multiple-And-Accumulate engines used in the implementation of the Finite Impulse Response (FIR) filter by half. The introduction of the NCO to up-convert to Fsample/4 from the under-sampled digital intermediate frequency IF allows a cost reduction without degrading the Spurious Free Dynamic Range (SFDR) specification of the system. SFDR is the amplitude in dB between the peak of the wanted signal and the unwanted highest secondary peak.

The present invention also provides a telecommunications receiver comprising the digital demodulator. Advantageously, the telecommunications receiver is a wideband radio receiver.

The present invention also provides a method of digital demodulation of a received signal comprising performing a complex frequency shift operation so as to provide a first signal at an intermediate frequency of one quarter of the sampling frequency, and a quadrature down conversion of the first signal so as to provide an output signal at baseband.

The present invention also provides a computer program loadable into the memory of a computer and adapted to perform the method.

BRIEF DESCRIPTION OF THE DRAWINGS

The present invention will be better understood from reading the following description of non-limiting embodiments, with reference to the attached drawings, wherein below:

FIG. 2 is a diagrammatic illustration of the FIR filter which shown in FIG. 1;

FIG. 3 is a graphical illustration in the frequency domain of the input signal;

FIG. 4 is a graphical illustration in the frequency domain of the digital IF signal;

FIG. 5 is a graphical illustration in the frequency domain of the upconverted digital IF signal; and FIG. 6 is a graphical illustration in the frequency domain of the resultant signal after quadrature down conversion.

Figure 1:
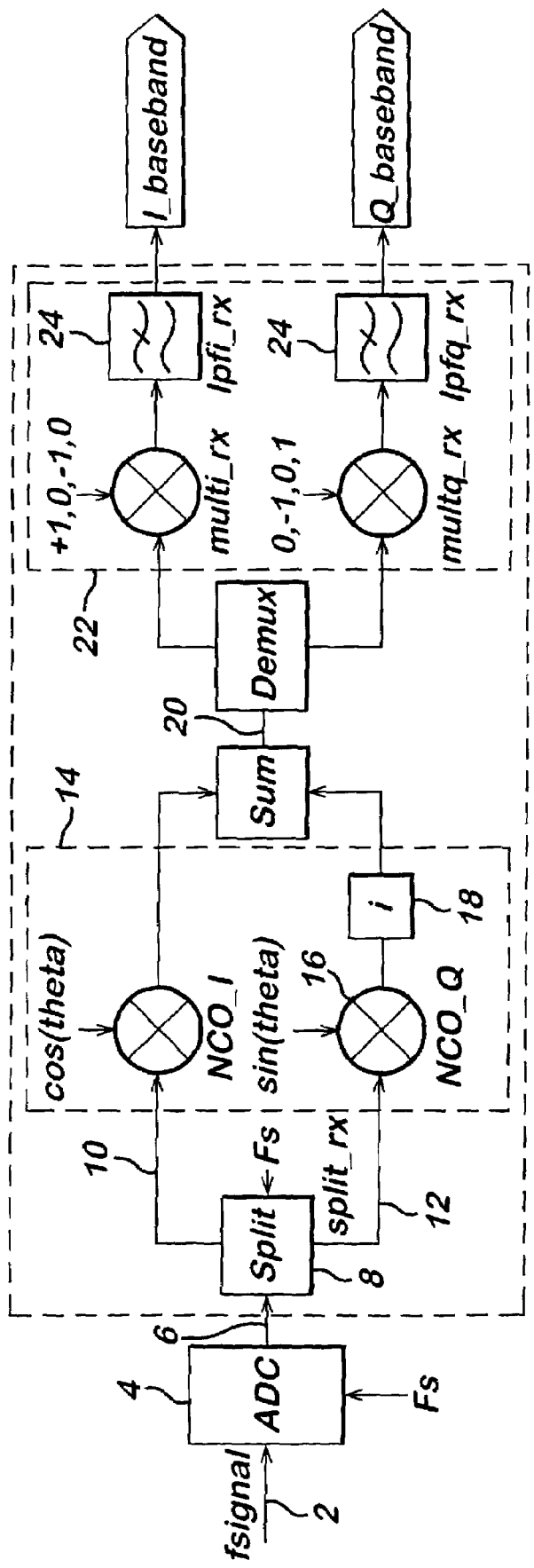
FIG. 1 is a diagrammatic illustration of a digital demodulator.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION

In the architecture illustrated in FIG. 1, input signal 2 of frequency fsignal is subsampled by the Analog-to-Digital Converter (ADC) 4 to produce a digital intermediate frequency IF signal 6. The digital intermediate frequency IF signal 6 which is output from the ADC is de-multiplexed by the splitter 8 into two data streams 10,12 and frequency shifted to a digital intermediate frequency IF at Fsample/4 using a numerically controlled oscillator NCO 14 which exploits the following equation:

$$V\text{out}=\text{Digital\_IF}*e^{i\theta}$$

$$\Rightarrow V\text{out}=\text{Digital\_IF}(\cos\theta+i\sin\theta)$$

Within the numerically controlled oscillator 14, a sine mixer 16 is used for NCO_Q, as illustrated so it is necessary to use a Hilbert transformer 18 to apply the 90 degree phase shift represented by the term i to the sine component of the signal. In some other embodiments (not shown) a simple cosine mixer for both NCO_I and NCO_Q is used instead. The NCO itself is a relatively simple in its construction, as quarter wave symmetry in the sine wave, and the constant phase offset between sine and cosine are exploited so that fewer data points need to be stored. Field Programmable Gate Arrays and Application Specific Integrated Circuit devices contain low cost Random Access Memory, which can be used to implement a look-up-table based solution to read data points in the correct order.

From the resulting Fsample/4 intermediate digital intermediate frequency IF signal 20, signal Vout is down-converted to base-band using an Fsample/4 sine, cosine mixer 22, which contains a zero in alternate coefficients. This uses the sequence:

| multi_rx | +1, 0, −1, 0 |
| multq_rx | 0, −1, 0, +1 |

This is, a quadrature down conversion operation, which allows every second MAC operation in the FIR filter 24 to be omitted.

For completeness, the FIR filter 24 structure is shown in FIG. 2 and represents the equation $$y(k)=w_0(k)+w_1(k-1)+w_2(k-2)+\ldots+w_{N-1}x(k-N+1)$$

where x(k) is input signal, w(n) are FIR filter coefficients, and y(k) is output signal.

EXAMPLE

To illustrate the technique, consider an input signal of a simple sine tone (rather than a more usual wideband signal), at 249.6 MHz. This was numerically under-sampled at a rate of Fsample=61.44 MHz, to obtain a digital intermediate frequency IF at 3.84 MHz, according to the relationship:

Digital IF=(Fsignal mod Fsample)

i.e. the digital intermediate frequency IF is the remainder left from subtracting the maximum integral multiple of the sampling frequency (which is less than the sampling frequency) from the signal frequency. The input signal and digital intermediate frequency IF of this example are represented in the frequency domain in FIGS. 3 and 4 respectively.

The digital intermediate frequency IF produced is then up-converted to Fsample/4—i.e. 15.36 MHz—by implementing the complex frequency shift as illustrated in FIG. 1. This resulted in the signal illustrated in FIG. 5, namely a 15.36 MHz digital intermediate frequency IF.

A standard quadrature down conversion, using the sequence:

| multi_rx | +1, 0, −1, 0 |
| multq_rx | 0, −1, 0, +1 | was then used to shift the signal back down to base-band, as illustrated in FIGS. 1 and 6. The I, Q channel filter (lpfi_rx, lpfq_rx) 24, is thus simplified due to exploitation of the alternate zeros in the multi_rx and multq_rx sequence.

For simplicity, a sine-tone has been used in this example to illustrate the technique. However, the technique is directly applicable to wideband signals also.

While the particular invention has been described with reference to illustrative embodiments, this description is not meant to be construed in a limiting sense. It is understood that although the present invention has been described, various modifications of the illustrative embodiments, as well as additional embodiments of the invention, will be apparent to one of ordinary skill in the art upon reference to this description without departing from the spirit of the invention, as recited in the claims appended hereto. Consequently, the method, system and portions thereof and of the described method and system may be implemented in different locations, such as network elements, the wireless unit, the base station, a base station controller, a mobile switching center and/or a radar system. Moreover, processing circuitry required to implement and use the described system may be implemented in application specific integrated circuits, software-driven processing circuitry, firmware, programmable logic devices, hardware, discrete components or arrangements of the above components as would be understood by one of ordinary skill in the art with the benefit of this disclosure. Those skilled in the art will readily recognize that these and various other modifications, arrangements and methods can be made to the present invention without strictly following the exemplary applications illustrated and described herein and without departing from the spirit and scope of the present invention It is therefore contemplated that the appended claims will cover any such modifications or embodiments as fall within the true scope of the invention.

We claim:

1. A digital demodulator comprising:
    an analog to digital converter arranged to receive an input signal and to provide a subsampled digital intermediate frequency signal;
    means for performing a complex frequency shift operation on said subsampled digital intermediate frequency signal, provided to said means by said analog to digital converter, to provide a first signal at an intermediate frequency of one quarter of a sampling frequency; and
    a quadrature down converter operative to down convert the first signal to provide an output signal at baseband.

2. A digital demodulator according to claim 1, in which the means is a numerically controlled oscillator NCO.

3. A digital demodulator according to claim 2, in which the numerically controlled oscillator NCO comprises a sine mixer connected to a Hilbert transformer operative to shift the phase of the sine component of the signal by 90 degrees.

4. A digital demodulator according to claim 1, in which the quadrature down converter comprises an Fsample/4 sine and cosine mixer and FIR filters of respective real and imaginary components.

5. A digital demodulator according to claim 1, in which the subsampled signal has a frequency less than one quarter of the sampling frequency.

6. A telecommunications receiver comprising a digital demodulator according to claim 1.

7. A telecommunications receiver according to claim 6, which is a wideband radio receiver.

8. A method of digital demodulation of a received signal comprising:
    converting an analog input signal to a digital subsampled intermediate signal;
    performing a complex frequency shift operation on said digital subsampled intermediate signal to provide a first signal at an intermediate frequency of one quarter of the sampling frequency; and
    performing a quadrature down conversion of the first signal to provide an output signal at baseband.

9. A computer program loadable into the memory of a computer and adapted to perform the method of claim 8.

* * * * *